US007303953B2

(12) United States Patent
Bouche et al.

(10) Patent No.: US 7,303,953 B2
(45) Date of Patent: Dec. 4, 2007

(54) PRODUCTION OF AN INTEGRATED CAPACITOR

(75) Inventors: Guillaume Bouche, Grenoble (FR); Jean-Christophe Giraudin, Bernin (FR)

(73) Assignee: STMicroelectronics S.A., Montrouge (FR)

( * ) Notice: Subject to any disclaimer, the term of this patent is extended or adjusted under 35 U.S.C. 154(b) by 98 days.

(21) Appl. No.: 11/298,910

(22) Filed: Dec. 9, 2005

(65) Prior Publication Data

US 2006/0157820 A1 Jul. 20, 2006

(30) Foreign Application Priority Data

Dec. 10, 2004 (FR) ................................. 04 13199

(51) Int. Cl.
*H01L 21/8242* (2006.01)
(52) U.S. Cl. .................... 438/248; 438/243; 438/391; 438/386
(58) Field of Classification Search ........ 438/243–248, 438/386–391
See application file for complete search history.

(56) References Cited

U.S. PATENT DOCUMENTS

| 4,741,802 | A |   | 5/1988  | Okumura ..................... 56/648  |
| 5,466,625 | A | * | 11/1995 | Hsieh et al. ................ 438/155 |
| 6,700,150 | B1|   | 3/2004  | Wu ............................ 257/296 |
| 6,787,836 | B2|   | 9/2004  | Clevenger et al. .......... 257/296 |
| 2001/0039087 | A1 |  | 11/2001 | Jammy et al. .............. 438/243 |

* cited by examiner

*Primary Examiner*—Dung A. Le
(74) *Attorney, Agent, or Firm*—Lisa K. Jorgenson; Hai Han; Seed IP Law Group PLLC

(57) ABSTRACT

A process for producing a capacitor integrated into an electronic circuit comprises the formation of a trench in a substrate through a conductive portion similar to an MOS transistor gate. Alternating conductive, insulating and conductive layers are deposited inside the trench T in order to form a lower electrode, a dielectric and an upper electrode of the capacitor, respectively. The conductive portion is used to electrically connect the lower electrode to other electronic components of the circuit without an additional cost with respect to the connection of the circuit transistors.

20 Claims, 2 Drawing Sheets

Figure 1:
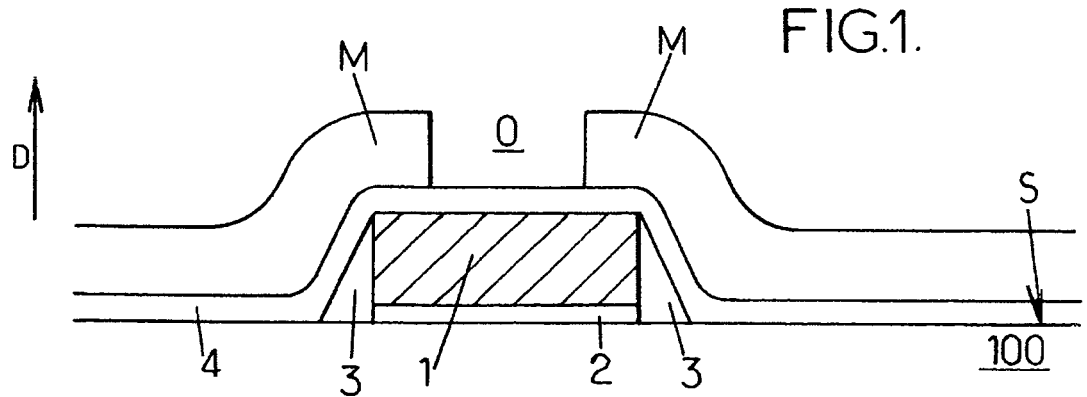

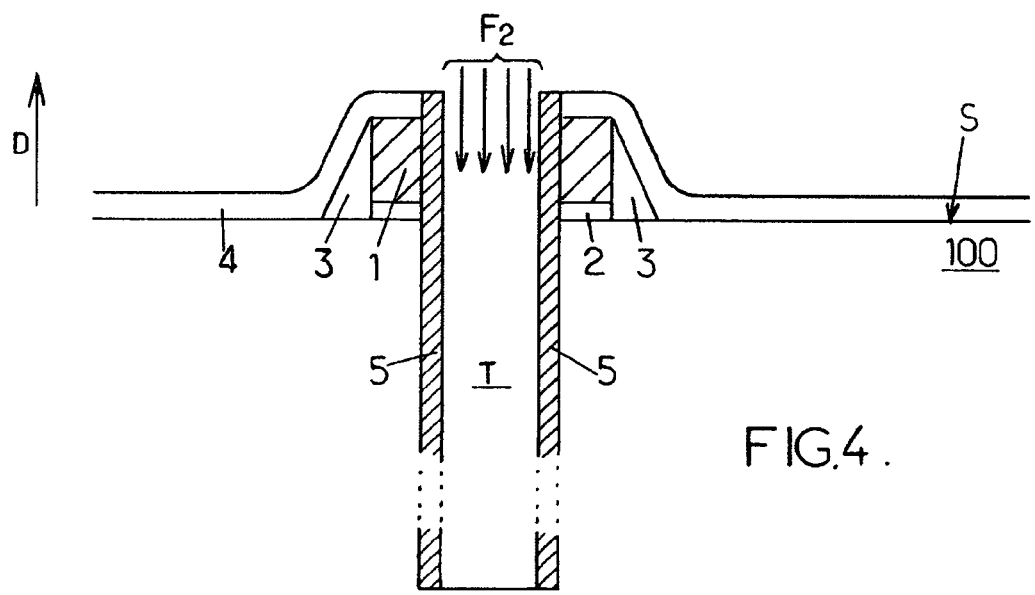
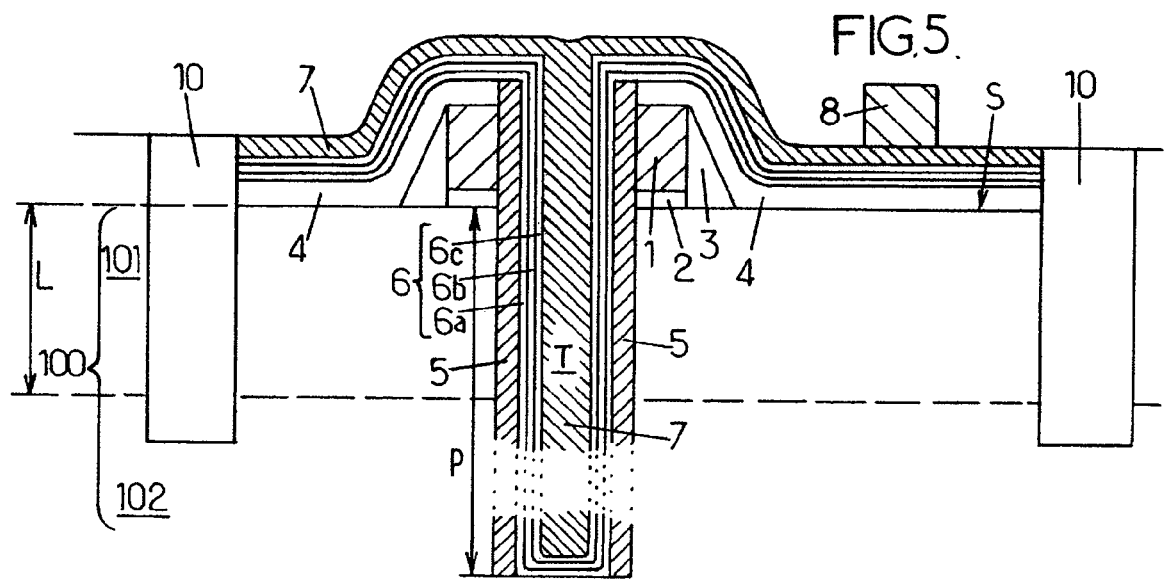

PRODUCTION OF AN INTEGRATED CAPACITOR

BACKGROUND OF THE INVENTION

1. Field of the Invention

The present invention relates to a process for producing an integrated capacitor and to a circuit comprising a capacitor thus produced.

2. Description of the Related Art

Several methods are used to incorporate a capacitor into an integrated electronic circuit. They may be divided into two categories, depending on the position of the capacitor in the circuit.

The methods of the first category result in a capacitor that is located in one of the interconnection levels placed above the substrate that carries the integrated circuit. Capacitors of the MIM (metal-insulator-metal) type are thus produced, for which the electrodes are parallel to the surface of the substrate. Because of this orientation, such an MIM capacitor occupies a large surface portion projected onto the substrate. The resulting footprint makes it more difficult to place metal tracks and vias within the interconnect layers. Correspondingly, the capacitance of such a capacitor is limited by the available area within the interconnect layer. Capacitors whose electrodes are perpendicular to the interconnect layer have also been produced, but their dimensions and their capacitance are limited by the thickness of the interconnect layer, which is of the order of a few microns.

The methods of the second category result in a capacitor located at the surface of the substrate, at the same level as the transistors of the circuit. Capacitors of the MIS (metal-insulator-semiconductor) type fall within this category, but their capacitance is in general quite low. The capacitors used in the fabrication of DRAM memories are also located at the surface of the substrate. They are placed inside trenches formed in the substrate and are obtained from materials deposited in succession in each trench. Their low capacitance is suitable for operation in two states, in which the capacitor is respectively charged or discharged. Furthermore, the production of an electrical connection to the lower electrode of such a DRAM capacitor may be difficult to achieve. It is often obtained by doping a region of the substrate that is in contact with the lower electrode of the capacitor.

U.S. Pat. No. 6,787,836 discloses a process for producing an integrated circuit that makes it possible to produce a capacitor having one of its electrodes at the same metallization level as transistor gates. The capacitor is located between the surface of the substrate and the first interconnect layer. Given that its electrodes are parallel to the surface of the substrate, it has a large footprint thereon, and its capacitance is consequently limited. Furthermore, the process described in that document involves three successive masks. It is therefore particularly lengthy, and a high fabrication efficiency is certainly difficult to achieve.

BRIEF SUMMARY OF THE INVENTION

In one embodiment, the present invention provides a process for producing a capacitor integrated into an electronic circuit that does not have the abovementioned drawbacks.

In particular, the process comprises the following steps:

a) forming a portion of a first conductive material above a surface of an integrated electronic circuit substrate, said portion being designed to make a first electrical connection;

b) forming a mask on the substrate, said mask having an aperture located at least partly above the portion of first conductive material;

c) forming a trench extending depthwise into the substrate beneath the surface of the substrate, through the aperture of the mask by anisotropic etching;

d) removing the mask;

e) forming a layer of a second conductive material on the walls of the trench that are substantially perpendicular to the surface of the substrate;

f) depositing at least one layer of insulating material on the layer of second conductive material in the trench, followed by a layer of a third conductive material; and g) forming a second electrical connection connecting the layer of third conductive material.

Furthermore, the portion of first conductive material is formed at step a) simultaneously with at least one other portion intended to constitute an MOS transistor gate.

In a capacitor thus produced, the portions of the layers of first and second conductive materials that are located in the trench constitute the two electrodes. The intermediate layer of insulating material constitutes the dielectric placed in the inter-electrode space.

Such a capacitor is placed in a trench within the substrate of an integrated electronic circuit. It is therefore produced during the first part of the fabrication of the integrated circuit, before the interconnect layers. Given that there are fewer impurities in an integrated-circuit fabrication line in the upstream part or front end of the line, the materials that make up the capacitor have electrical characteristics that are better controlled. In particular, the material or materials that make up the dielectric of the capacitor have particularly good electrical insulation characteristics. Among these may be mentioned high values of leakage resistance and of breakdown voltage. These good characteristics provide the circuit with a high level of reliability.

Moreover, the electrodes of the capacitor are oriented perpendicular to the surface of the substrate. The capacitor therefore occupies only a small portion of this surface, even when the electrodes are of large dimensions in order to obtain a capacitor of high capacitance. Owing to this orientation perpendicular to the surface of the substrate, the substrate may be reduced in size for a circuit containing a capacitor of the same capacitance. The cost of the circuit is therefore consequently reduced.

Another advantage of a capacitor produced results from the arrangement of the volume of first conductive material on the surface of the substrate. This volume is in electrical contact with the lower electrode of the capacitor, and this makes it easy to connect it to other electronic components of the integrated circuit.

Finally, the portion of first conductive material is formed at the same time as at least one gate of an MOS transistor of the circuit. In other words, the portion of first conductive material belongs to the level comprising the gates of the integrated circuit. The connection between the lower electrode of the capacitor and other components of the circuit and the connections of the gates of the MOS transistors that the circuit comprises are therefore made simultaneously. Specific steps for connecting the lower electrode of the capacitor are thus dispensed with. As a result, the total number of steps needed to fabricate the circuit is reduced and the cost of the circuit is therefore also reduced.

The invention also provides an integrated electronic circuit that includes a capacitor produced according to a process as described above.

Other features and advantages of the present invention will become apparent in the following description of a non-limiting exemplary embodiment with reference to the appended FIGS. 1 to 5, which illustrate various steps in a process according to the invention.

BRIEF DESCRIPTION OF THE SEVERAL VIEWS OF THE DRAWING(S)

FIGS. 1-5 illustrate in a stepwise fashion an embodiment of the present invention for integrating a capacitor into an electronic circuit.

DETAILED DESCRIPTION OF THE INVENTION

In these figures, for the sake of clarity, the dimensions of the various elements shown have not been drawn to scale. These figures are sectional views of a substantially planar substrate, considered in a plane perpendicular to the surface of the substrate. The substrate lies in the lower part of each figure and D denotes a direction perpendicular to the surface of the substrate, directed upwards in the figures. In the rest of the description, the terms "on", "under", "lower" and "upper" are used with reference to this orientation. Moreover, in all the figures, identical references correspond to identical elements.

In what follows, the elementary steps of the process for fabricating an integrated electronic circuit will not be considered in detail, these being known to those skilled in the art. The description here will be limited to a succession of elementary steps for producing a capacitor according to the invention.

FIG. 1 shows an integrated circuit in the process of being fabricated. Fabrication steps have already been carried out for producing MOS (Metal-Oxide-Semiconductor) transistors on the surface S of a substrate 100 of the circuit. The substrate 100 is for example made of silicon. The following elements will thus have already been produced, for each MOS transistor: a gate insulation layer; a portion of a first conductive material intended to constitute the gate of the transistor; and a spacer that surrounds the gate parallel to the surface S. The gate insulation layer may for example be made of silica ($SiO_2$). The gate may be made of polysilicon and the spacer may be made of silicon nitride ($Si_3N_4$). The spacer may also be formed from a stack of several electrically insulating layers. Such elements are formed simultaneously on the surface S at the locations of the MOS transistors of the final circuit, as well as at the locations of the capacitors produced according to the invention.

In the case of an MOS transistor, the substrate 100 is doped so as to obtain appropriate electrical conduction in that zone of the substrate 100 lying under the gate and intended to form the channel. Additional steps for doping the drain and source zones are also carried out after production of the spacer. These doping steps are carried out selectively at the locations on the substrate 100 that correspond to transistors of the final circuit and are not carried out at the locations that correspond to capacitors. Thus, the substrate 100 is not electrically conductive at the locations intended for producing capacitors according to the invention.

In FIG. 1, the references 1, 2 and 3 indicate a polysilicon portion, an intermediate layer and a spacer respectively, produced as an MOS transistor gate, a gate insulation layer and an MOS transistor spacer, respectively. The portion 1 may have an extension (not shown) lying parallel to the surface S and intended to electrically connect the portion 1 to another electronic component of the circuit.

A layer 4, for example made of silica, may be formed on the entire circuit, for example using a plasma-enhanced CVD (Chemical Vapour Deposition) process. The layer 4 covers the portion 1, the spacer 3 and the substrate 100. Deposition conditions are adopted whereby the layer 4 is obtained with a high density. Optionally, the circuit may be heated in order to increase the density of the layer 4. It should be pointed out that the layer 4 is not essential for implementing the invention, but it does mean that a capacitor with better controlled shape and dimensions can be obtained. Furthermore, this layer 4 protects the other components of the circuit during the steps of the process that are specifically dedicated to the production of a capacitor.

A resist mask M is then formed on the circuit by photolithography. It has an aperture O located above the portion 1.

Figure 2:
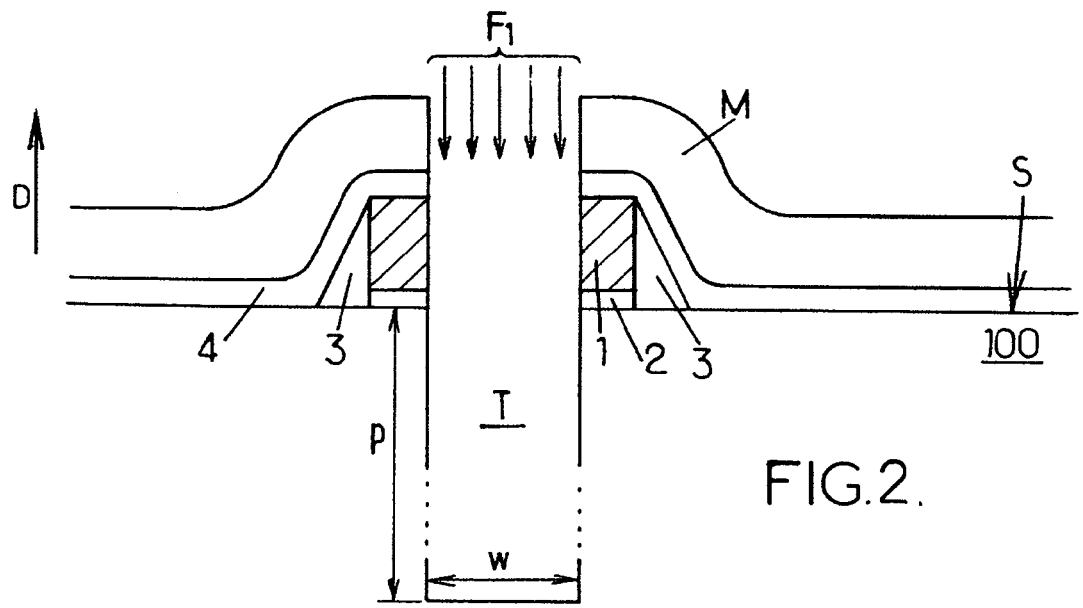

The circuit is anisotropically etched, by bombarding it with a flux of particles F1 directed parallel to the direction D, but in the opposite sense thereto. The flux F1 is stopped by the mask M outside the aperture O. The layer 4, the portion 1, the layer 2 and the substrate 100 are etched in succession through the aperture O (FIG. 2). The nature of the particles of the flux F1 may optionally be adapted during this etching, according to the chemical nature of the material in which the etching front progresses at a given instant. A trench T is thus formed through the layer 4, the portion 1 and the layer 2, which trench extends depthwise into the substrate 100 parallel to the direction D. The layer 4 that supports the mask M reinforces the latter at the edges of the trench T so that the edges of the mask M undergo only limited deformation under the effect of the flux F1. The width w of the trench T is thus precisely determined by the aperture O for the mask M. This width w is large enough for conformal coatings to be able to be deposited subsequently inside the trench T, without prematurely closing off the trench T in a part of the latter lying near the surface S. The depth p of the trench T may be greater than 30 μm (microns). For example, it may be 100 μm. Furthermore, the trench T may have any length in the direction perpendicular to the plane of the figures.

Figure 3:
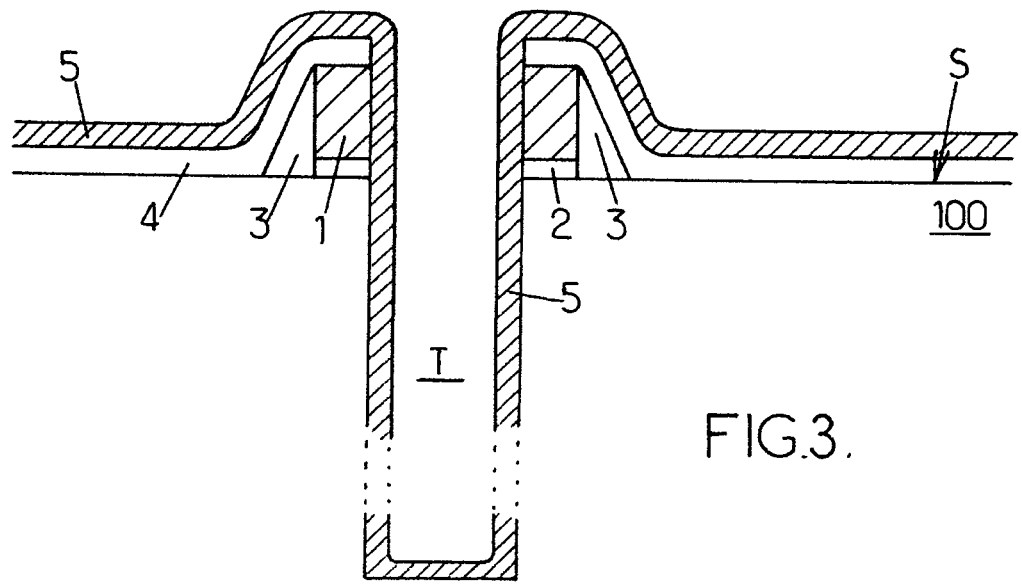

The mask M is then removed, for example by dissolving it, and then a layer 5 of a second electrically conductive material is deposited on the circuit. The process and the parameters used for depositing the layer 5 are chosen so as to obtain a conformal layer 5, that is to say one that has an approximately constant thickness over the entire circuit and inside the trench T (FIG. 3). In particular, a low deposition pressure is adopted so that the gaseous components forming the precursors of the second conductive material penetrate right to the bottom of the trench T. The layer 5 may for example be based on polysilicon. Its thickness may be of the order of 100 nanometres. In practice, when the depth p of the trench T is large, the thickness of the layer 5 tends, depending on the deposition process, to be less at the bottom of the trench T than near the surface S. The deposition of the layer 5 is then extended up to a point such that the layer formed covers, with no discontinuity, the walls of the trench T down to the bottom of the latter. Either a CVD (chemical vapor deposition) process or an ALD (atomic layer deposition) process may be used to produce the layer 5.

An anisotropic etching operation is then carried out so as to remove the layer 5 in at least one zone of the substrate 100 outside the trench T (FIG. 4). A flux F2 of particles is used for this etching, the said flux again being directed against the surface of the circuit parallel to the direction D, but in the opposite sense thereto. Advantageously, no mask is used for this etching operation so that the layer 5 is removed from all places on the circuit where the layer 5 is oriented perpendicular to the direction D. In particular, that portion of the layer 5 lying at the bottom of the trench T and oriented parallel to the surface S is partly or completely removed. The same applies to that portion of the layer 5 that lies on the circuit around the portion 1, outside the spacer 3. Away from the trench T, the layer 4 prevents the particles of the flux F2 from damaging other components of the circuit that have already been partly produced on the surface S. For this reason, the said layer 4 is called a stop layer.

Next, a layer 6 of insulating material and a layer 7 of a third conductive material are deposited in succession on the circuit and in the trench T (FIG. 5). Preferably, the layers 6 and 7 are conformal layers. They therefore extend as far as the bottom of the trench T, thus producing a capacitor with a high capacitance, the capacitance being defined by the dimensions of the trench T and the mean thickness of the layer 6. The layers 6 and 7 also cover the circuit outside the trench T. Furthermore, the layer 7 may fill the trench T so that the surface of the circuit does not have a cavity at the location of the capacitor. The subsequent production of interconnect levels placed above the substrate 100 is therefore facilitated.

The layer 7 may be made of polysilicon. It is electrically isolated from the layer 5 by the layer 6.

Optionally, the layer 6 may be composed of three elementary layers 6a, 6b and 6c deposited in succession. The layer 6a may be made of silica, so as to have a good covering power for covering the layer 5 inside the trench T. The choice of silica as material for the layer 6c allows good adhesion of the layer 7. The material of the intermediate layer 6b may be a dielectric selected so as to have a high dielectric permittivity. This may for example be hafnium oxide ($HfO_2$). The mean thicknesses of the layers 6a-6c may for example be 20 nm (nanometres), 50 nm and 20 nm, respectively. Alternatively, the following materials may for example also be integrated into such a composite layer 6: silicon nitride ($Si_3N_4$), alumina ($Al_2O_3$), aluminium nitride (AlN), tantalum oxide ($Ta_2O_5$) and oxynitride-type materials.

The capacitor is then complete. It may for example have a capacitance of greater than 30 $nF/mm^2$ (nanofarads per square millimeter of surface S of substrate 100 occupied by the capacitor). This capacitance is determined by the dimensions of the trench T and the nature and thickness of the layer 6. In the trench T, the layers 5 and 7 form the lower electrode and the upper electrode of the capacitor, respectively. The electrode 5 is in direct contact with the portion 1 that constitutes an electrical connection between the capacitor and other components of the circuit.

In the process that has just been described, the electrical connection of the lower electrode of the capacitor required no additional steps specifically dedicated to making such a connection. This is because this connection is made directly at the same time as the electrical connections of the gates of the MOS transistors of the circuit, and belongs to the same circuit level as said gates.

An electrical connection terminal 8 for the upper electrode of the capacitor may then be formed on the layer 7. Preferably, the terminal 8 is located in a zone of the substrate 100 having no material of the layer 5. In this way, the risk of unintentionally creating an electrical short-circuit path between the two electrodes of the capacitor when forming the terminal 8 is reduced. In the process that has been described, the terminal 8 may be located at any point on the surface of the circuit outside the zone of the substrate 100 that corresponds to the trench T. This is because the layer 5 has been entirely removed outside the trench T, and because the layer 7 covers the circuit without any discontinuity.

Among the advantages of a process for producing a capacitor as described above, the following may be mentioned or recalled:

only a single additional etching mask is needed, compared with masks used for producing the MOS transistors of the circuit. This is because the layers 5-7 are deposited in the form of "full-wafer" coatings, that is to say they cover the entire circuit. The layer 5 is also etched without using a mask. For complete integration, a second mask will however be needed to etch the material of the upper electrode of the capacitor;

no polishing step of the CMP (Chemical-Mechanical Polishing) type is necessary; and the process steps in addition to the production of MOS transistors are simple and well controlled at the present time.

Such a process is therefore both short and simple. High production yields can therefore be easily achieved.

For certain electronic circuits, the substrate 100 may include an epitaxially grown upper conductive silicon layer 101 (FIG. 5). Such a layer extends down to a depth L below the surface S. It is limited either by an insulating layer 102 in the case of SOI (Silicon On Insulator) technology or by a reduction in doping concentration of the substrate at the depth L. In this case, the process may furthermore include a step consisting in forming, within the substrate 100, a volume 10 of electrical insulation that surrounds the capacitor parallel to the surface S. Such a volume of electrical insulation may be of the LOCOS (Local Oxidation Of Silicon) type or of the STI (Shallow Trench Isolation) type that are well known. When the volume 10 penetrates into the substrate 100 down to a depth of greater than L, the formation of an electrical short-circuit path in the substrate 100 between the lower electrode of the capacitor and other electronic components of the circuit located outside the volume 10 is prevented.

Finally, it should be pointed out that some of the elements of the capacitor that have been described above are not necessary for implementing the invention. This applies in particular to the intermediate layer 2 and the spacer 3, which are produced without any additional cost at the location of the capacitor during production of the MOS transistors of the circuit.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A process for producing an integrated capacitor, comprising the following steps:

forming a portion of a first conductive material above a surface of an integrated electronic circuit substrate, said portion being designed to make a first electrical connection;

forming a mask on the substrate, said mask having an aperture located at least partly above the portion of the first conductive material;

forming a trench extending depthwise into the substrate beneath the surface of the substrate, through the aperture of the mask by anisotropic etching, said trench having walls substantially perpendicular to the surface of the substrate;

removing the mask;

forming a layer of a second conductive material on the walls of the trench;

depositing a layer of an insulating material on the layer of the second conductive material in the trench, followed by a layer of a third conductive material; and forming a second electrical connection connecting to the layer of the third conductive material, wherein the portion of the first conductive material is formed simultaneously with another portion intended to constitute a MOS transistor gate, and wherein the layer of the second conductive material is directly in contact with the portion of the first conductive material.

2. The process according to claim 1, wherein the step of forming the layer of the second conductive material comprises the following substeps:
forming a conformal layer of the second conductive material on the substrate and inside the trench; and
anisotropically etching so as to remove the layer of the second conductive material in a zone of the substrate outside the trench.

3. The process according to claim 2, wherein the second electrical connection is formed in the zone of the substrate with no layer of second conductive material.

4. The process according to claim 1, wherein the respective layer of insulating material and layer of the third conductive material are conformal.

5. The process according to claim 1, which further includes, covering the portion of the first conductive material and the substrate with a stop layer prior to the step of forming the mask on the substrate.

6. The process according to claim 1, wherein the second conductive material comprises polysilicon.

7. The process according to claim 1, which further includes forming, within the substrate, an electrical isolation volume that surrounds the capacitor parallel to the surface of the substrate.

8. The process according to claim 1, wherein the trench has a depth of greater than 30 microns.

9. The process according to claim 1, wherein the capacitor has a capacitance of greater then 30 nanofarads per square millimeter of surface of the substrate occupied by said capacitor.

10. An integrated electronic circuit comprising a capacitor produced according to a method comprising:
forming a portion of a first conductive material above a surface of an integrated electronic circuit substrate, said portion being designed to make a first electrical connection;
forming a mask on the substrate, said mask having an aperture located at least partly above the portion of the first conductive material;
forming a trench extending depthwise into the substrate beneath the surface of the substrate, through the aperture of the mask by anisotropic etching, said trench having walls substantially perpendicular to the surface of the substrate;
removing the mask;
forming a layer of a second conductive material on the walls of the trench;
depositing a layer of insulating material on the layer of second conductive material in the trench, followed by a layer of a third conductive material; and
forming a second electrical connection connecting to the layer of the third conductive material,
wherein the portion of the first conductive material is formed simultaneously with another portion intended to constitute a MOS transistor gate, and wherein the layer of the second conductive material is directly in contact with the portion of the first conductive material.

11. The integrated electronic circuit of claim 10 further comprising an electrical isolation volume that surrounds the capacitor parallel to the surface of the substrate.

12. The integrated electronic circuit according to claim 10, wherein the trench has a depth of greater than 30 microns.

13. The integrated electronic circuit according to claim 10, wherein the capacitor has a capacitance of greater then 30 nanofarads per square millimeter of surface of the substrate occupied by said capacitor.

14. A process of manufacturing an integrated capacitor including a capacitor and a MOS transistor, comprising:
forming a layer of a first conductive material above a surface of an integrated electronic circuit substrate;
forming a trench through the layer of the first conductive material and extending depthwise into the substrate beneath the surface of the substrate, said trench having substantially vertical walls, said layer of the first conductive material having a remaining portion which forms a first electrical connection of the capacitor,
depositing a layer of a second conductive material on the walls of the trench, said layer of the second conductive material being a lower electrode of the capacitor and in direct contact with the first electrical connection;
depositing a layer of an insulating material on the layer of the second conductive material in the trench and outside of the trench;
depositing a layer of a third conductive material overlying the layer of the insulating material, said layer of the third conductive material being an upper electrode of the capacitor;
forming a second electrical connection connecting to the upper electrode, and
forming a gate of a MOS transistor, wherein the first electrical connection is formed simultaneously with forming the gate of the MOS transistor.

15. The process of claim 14 wherein the layer of the insulating material is a composite layer having a plurality of elementary insulating layers.

16. The process of claim 14 further comprising an electrical isolation volume that surrounds the capacitor parallel to the surface of the substrate.

17. The process according to claim 14, wherein the trench has a depth of greater than 30 microns.

18. The process according to claim 14, wherein the capacitor has a capacitance of greater then 30 nanofarads per square millimeter of surface of the substrate occupied by said capacitor.

19. A process for producing an integrated capacitor, comprising:
forming a first conductive layer above a surface of a semiconductor substrate;
forming a first trench extending through the first conductive layer and into the substrate beneath the surface of the substrate, the first trench having sidewalls;
forming a second conductive layer on the sidewalls of the first trench, the second conductive layer forming a first electrode of the capacitor and defining a second trench within the first trench, wherein the second conductive layer is in electrical contact with the first conductive layer and;
forming an insulating layer on the second conductive layer and within the second trench, the insulating layer defining a third trench within the second trench; and
forming a third conductive layer in the third trench, the third conductive layer forming a second electrode of the integrated capacitor.

20. The process of claim 19 wherein forming the insulating layer comprises sequentially depositing a first, a second and a third dielectric layers, the first dielectric layer being adhered to the second conductive layer, and the third dielectric layer being adhered to the third conductive layer.

* * * * *